United States Patent
Choi et al.

(10) Patent No.: US 7,653,859 B2
(45) Date of Patent: Jan. 26, 2010

(54) SYSTEM, APPARATUS AND METHOD FOR TRANSMITTING AND RECEIVING DATA CODED BY LOW DENSITY PARITY CHECK CODE HAVING VARIABLE CODING RATE

(75) Inventors: Eoi-Young Choi, Seoul (KR); Jaehong Kim, Seoul (KR); Jae-hyun Koo, Seoul (KR); Seung-bum Suh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 447 days.

(21) Appl. No.: 11/111,914

(22) Filed: Apr. 22, 2005

(65) Prior Publication Data
US 2005/0246616 A1 Nov. 3, 2005

Related U.S. Application Data

(60) Provisional application No. 60/564,244, filed on Apr. 22, 2004.

(30) Foreign Application Priority Data
Feb. 14, 2005 (KR) ...................... 10-2005-0011983

(51) Int. Cl.
*H03M 13/00* (2006.01)
(52) U.S. Cl. .................. 714/755; 714/788; 714/786; 714/790; 714/762; 714/801; 370/206
(58) Field of Classification Search ............. 714/801, 714/752, 755, 786, 762, 788, 790; 370/206
See application file for complete search history.

(56) References Cited

U.S. PATENT DOCUMENTS

2004/0100897 A1* 5/2004 Shattil ...................... 370/206

FOREIGN PATENT DOCUMENTS

| JP | 2002-176364 A | 6/2002 |
| KR | 2003-0036227 A | 5/2003 |

(Continued)

OTHER PUBLICATIONS

Jeongseok Ha et al: "Optimal puncturing of irregular low-density parity-check codes" ICC 2003. 2003 IEEE International Conference on Communications. Anchorage, AK, May 11-15, 2003, IEEE International Conference on Communications, New York, NY: IEEE, US, vol. vol 1 of 5, May 11, 2003, pp. 3110-3114, XP010643019.

(Continued)

*Primary Examiner*—Guy J Lamarre
(74) *Attorney, Agent, or Firm*—Sughrue Mion, PLLC

(57) ABSTRACT

A system, an apparatus and a method for transmitting/receiving data coded by a low density parity check matrix code are provided. The apparatus for transmitting data coded by a low density parity check code includes: a low density parity check encoder for encoding input data based on the low density parity check code; and a bit puncturer for puncturing columns in an order of columns which least degrade a performance caused by puncturing in the low density check code according to a code rate of an output data. Accordingly, the low density parity check code having superior performance can be implemented to the next generation mobile communication system supporting various code rates.

30 Claims, 10 Drawing Sheets

FOREIGN PATENT DOCUMENTS

WO 02/054603 A2 7/2002
WO 03/032499 A1 4/2003

OTHER PUBLICATIONS

Futaki H et al: "Low-Density Parity-Check (LDPC) Coded OFDM Systems With M-PSK" VTC Spring 2002. IEEE 55th. Vehicular Technology Conference. Proceedings. Birmingham, AL, May 6-9, 2002, IEEE Vehicular Technology Conference, New York, NY: IEEE, US, vol. vol. 2 of 4. Conf. 55, May 6, 2002, pp. 1035-1039, XP001214451.

Futaki H et al: "Performance of low-density parity-check (LDPC) coded OFDM systems" ICC 2002. 2002 IEEE International Conference on Communications. Conference Proceeding. New York, NY, Apr. 28-May 2, 2002, IEEE International Conference on Communications, New York, NY: IEEE, US, vol. vol. 1 of 5, Apr. 28, 2002, pp. 1696-1700.

* cited by examiner $$H' = \begin{bmatrix} h_{0,j_0} & h_{0,j_0} & \cdots & h_{0,j_{N_{P,MAX}-1}} & \cdots & h_{0,N-1} \\ h_{1,j_0} & h_{1,j_0} & \cdots & h_{1,j_{N_{P,MAX}-1}} & \cdots & h_{1,N-1} \\ h_{2,j_0} & h_{2,j_0} & \cdots & h_{2,j_{N_{P,MAX}-1}} & \cdots & h_{2,N-1} \\ \vdots & \vdots & \ddots & \vdots & \ddots & \vdots \\ h_{M-1,j_0} & h_{M-1,j_1} & \cdots & h_{M-1,j_{N_{P,MAX}-1}} & \cdots & h_{M-1,N-1} \end{bmatrix}$$

$\overleftrightarrow{N_P}$ (top), $\overleftrightarrow{N}$ (bottom)

SYSTEM, APPARATUS AND METHOD FOR TRANSMITTING AND RECEIVING DATA CODED BY LOW DENSITY PARITY CHECK CODE HAVING VARIABLE CODING RATE

CROSS-REFERENCE TO RELATED APPLICATIONS

This application claims priority from U.S. Provisional Application No. 60/564,244 filed Apr. 22, 2004 in the U.S. Patent and Trademark Office, and Korean Patent Application No. 2005-11983 filed Feb. 14, 2005 in the Korean Intellectual Property Office, the disclosures of which are incorporated herein by reference.

BACKGROUND OF THE INVENTION

1. Field of the Invention

Apparatuses, methods and systems consistent with the present invention relate to a transmitting/receiving data coded by a low density parity check matrix code, and more particularly, to transmitting/receiving data coded by a low density parity check matrix code for providing various code rates and superior performance.

2. Description of the Related Art

A cellular mode mobile telecommunication system was introduced in the United States in the late 1970's and an advanced mobile phone service (AMPS) was provided as a voice wireless communication service in Korea in the late 1980's. The advanced mobile phone service is an analog mode of a $1^{st}$ generation mobile communication system (1G). Subsequently, a $2^{nd}$ generation mobile communication system was commercialized in the mid 1990's and a part of International Mobile Telecommunication-2000 (IMT-2000) standard was commercialized in late 1990's as a $3^{rd}$ generation mobile communication system for providing improved and high speed wireless multimedia data service.

Recently, there are many studies in progress for developing the $3^{rd}$ generation mobile communication system into a $4^{th}$ generation mobile communication system (4G). The $4^{th}$ generation mobile communication system has been developed to achieve objects such as effective connection between a wired communication network and a wireless communication, and an integrated service. Therefore, various specifications of the $4^{th}$ generation mobile communication system have been standardized for developing technologies providing faster data transmission service as compared to the $3^{rd}$ mobile communication system.

Meanwhile, the most fundamental problem in communication is how to transmit data effectively and reliably through a channel. The next generation mobile communication requires a high speed communication system processing various information such as voice, image and data, and transmitting the processed information at high speed. Accordingly, an effective channel coding scheme is required for improving efficiency of the communication system.

Furthermore, rapid development of the mobile communication system has led to the need to develop a technology for transmitting large amounts of data in wireless networks comparable to wired networks. Therefore, increasing data transmission efficiency has become a major factor for improving a performance of the communication system. However, the mobile communication system may have difficulty transmitting large amounts of data at high speed due to unavoidable errors such as noise, interference and fading caused by channel conditions during data transmission. Accordingly, information data is often lost due to the errors.

For reducing information data loss caused by the error, various error-control techniques have been introduced and widely applied according to a characteristic of a channel. The various error-control techniques have increased the reliability of the mobile communication system. Among the various error-control techniques, an error-correcting code has been commonly used. Representative error-control techniques include a turbo code and a low density parity check (LDPC).

Meanwhile, the above mentioned channel coding is an essential constitutional element of a MODEM in a multiband orthogonal frequency division multiplexing (OFDM) system which is used in a wireless personal area network system.

FIG. 1 is a block diagram illustrating a conventional multiband OFDM system using convolution coder.

As shown in FIG. 1, the conventional multiband OFDM system includes a transmitting unit and a receiving unit. The transmitting unit includes a scrambler 110, a convolution encoder 111, a puncturer 112, a bit interleaver 113, a constellation mapper 114, an inverse fast fourier transform (IFFT) unit 115, a digital-to-analog (D/A) converter 116, a multiplier 117 and an antenna 118. The scrambler 110 receives and scrambles input data. The convolution encoder 111 encodes the scrambled data from the scrambler 110. The puncturer 112 punctures the encoded data from the convolution encoder 111 according to a code rate of data to be transmitted.

The bit interleaver 113 interleaves a bit to the punctured data and the constellation mapper 114 converts the bit-interleaved data to corresponding symbols. The IFFT unit 115 performs IFFT of the symbols and the transformed symbols are converted to analog signal by the D/A converter 116. The analog signal is multiplied with a carrier frequency $ex(j2\pi f_c t)$ by the multiplier 117 and the multiplied analog signal is transmitted to the receiving unit through the antenna 118.

The receiving unit of the multiband OFDM system includes a descrambler 120, an decoder 121, a de-puncturer 122, a de-interleaver 123, an FFT unit 124, two A/D converters 125*a*, 125*b*, two multipliers 126*a*, 126*b*, a low noise amplifier (LNA) 127, and an antenna 128. The LNA 127 receives a signal transmitted from the transmitting unit through the antenna 128 and amplifies the received signal. The two multipliers 126*a* and 126*b* divide the received signal into an I-channel signal and a Q-channel signal and the A/D converters 125*a* and 125*b* convert the I-channel signal and the Q-channel signal to digital signals.

The digital signal is fast-fourier transformed by the FFT unit 124 and the transformed digital signal is de-interleaved by the de-interleaver 123. The de-puncturer 122 inserts bits for each of the punctured bits. The bit inserted digital signal is decoded by the decoder 121 i.e., a viterbi decoder. Finally, the de-scrambler 120 de-scrambles the decoded signal for generating a final output data.

As mentioned above, the multiband OFDM system essentially requires an encoding operation and additional requires puncturing operation for puncturing the encoded data according to corresponding code rate in the transmitting unit.

The convolution encoder has been commonly used as the encoder for supporting various code rates. However, the convolution encoder has degraded bit error rate (BER) performance as compared to the LDPC encoder.

FIG. 2 is a graph showing a performance difference between a convolution coding and an LDPC coding.

Referring to FIG. 2, the graph shows packet error rates (PER) of an original signal 201, convolution coded signals 202, 203, 204 and LDPC coded signals 205, 206 and 207. The convolution coded signals 202, 203, 204 are encoded and interleaved based on the convolution encoding and have a code rate of ½, ⅝ and ¾, respectively. The LDPC coded signals 205, 206 and 207 are encoded based on the LDPC encoding and have a code rate of ½, ⅝ and ¾, respectively. According to the graph, there is a performance difference of about 6.8 dB between the convolution coded signals and the LDPC coded signals.

Therefore, the LDPC encoding has been considered as an encoding scheme for the next generation mobile communication system. However, the LDPC encoding scheme requires performing puncturing according to code rates when the LDPC encoding scheme is applied to the next generation mobile communication system supporting various code rates. If a random puncturing method is used in the LDPC encoding scheme as a method for puncturing, the performance would be degraded. Therefore, although the LDPC encoding scheme provides superior coding performance, there are difficulties in applying the LDPC encoding scheme to the mobile communication system supporting various code rates.

In order to overcome the above mentioned problem, a method using a plurality of mother codes according to corresponding code rate without puncturing the LDPC code in an Infineon has been introduced as encoding scheme for supporting various code rates without degradation of performance while using the LDPC coding scheme. This method improves performance as compared to the convolution encoding scheme. However, the method results in increased complexity because additional mother codes are required according to each code rate.

Therefore, there has been great demand for an encoding scheme having lower complexity and superior performance in a mobile communication system supporting various code rates.

SUMMARY OF THE INVENTION

Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above.

According to an aspect of the present invention, a system, an apparatus and a method are provided for transmitting/receiving data supporting various code rates by encoding data based on a low density parity check code, puncturing the encoded data and transmitting the punctured data in a mobile communication system.

According to another aspect of the present invention, a system, an apparatus and a method are provided for transmitting/receiving data supporting various code data by puncturing a bit of a location which is proper to recover a signal.

In accordance with an aspect of the present invention, there is provided an apparatus for transmitting data coded by a low density parity check code, including: a scrambler for scrambling input data to be transmitted; a low density parity check encoder for encoding the scrambled input data from the scrambler based on a low density parity check code; a bit puncturer for orderly puncturing columns in the low density check code which least degrade a performance caused by puncturing; a constellation mapper for converting the punctured data to a symbol mapped to each data; and a reverse fast-fourier transformer for reverse fast-fourier transforming the symbol for OFDM and transmitting the transformed data to a receiving side.

The apparatus may further include: a digital-to-analog converter for converting a digital signal processed in the reverse fast-fourier transformer to an analog signal; and a transmitting antenna for multiplying a carrier frequency signal to the analog signal and transmitting the multiplied analog signal to wireless environment.

The transmitting antenna may transmit data using ultra wideband frequency.

The low density parity check encoder includes a column permuting unit for replacing columns in the low density parity check code according to order of columns which least degrade a performance caused by puncturing and columns which least degrade a performance caused by puncturing may be orderly replaced with one from a left side column to a right side column or one from the right side column to the left side column.

The bit puncturer may puncture bits according to a code rate of the output data orderly from the most left column or from the most right column of the low density parity check code.

The low density parity check encoder may include: a parity check matrix generator for generating an M×N parity check matrix having a much lesser number of 1's among elements of 0 and 1; a column permutated matrix generator for generating a column permutated matrix by permuting columns of the parity check matrix according to an order of columns which least degrade a performance caused by puncturing; a generate matrix generator for generating a generate matrix from the column permutated matrix; and an encoding calculator for encoding the input data according to the generate matrix.

The column permutated matrix generator may include; a puncturing bit calculating unit for calculating the number of bits to be punctured according to a maximum code rates among required code rates; a punctured bit position determining unit for determining the number of columns to be permutated according to the calculated number of bits and determining the determined number of columns degrading least performance caused by puncturing as columns to be replaced; and a column replacing unit for orderly replacing the determined columns.

The punctured bit position determining unit may determine only one variable node to be punctured among a plurality of variable nodes connected to one check node on a factor graph associated with an M×N parity check matrix.

In accordance with another aspect of the present invention, there is provided an apparatus for transmitting data coded by a low density parity check code, including: a low density parity check encoder for encoding input data based on the low density parity check code; and a bit puncturer for puncturing columns in an order of columns which least degrade a performance caused by puncturing in the low density check code according to a code rate of an output data.

The low density parity check encoder may include a column permuting unit for permuting columns in an order of columns which least degrade a performance caused by puncturing in the low density parity check code.

Columns which least degrade a performance caused by puncturing orderly may be permuted from a right side column or from a left side column in the low density parity check code.

The bit puncturer may puncture bits according to a code rate of the output data orderly from a left side column in the low density parity check code.

The low density parity check encoder may include: a parity check matrix generator for generating an M×N parity check matrix having a lesser number of 1's among elements of 0 and 1; a column permutated matrix generator for generating a column permutated matrix by permuting columns of the parity check matrix according to an order of column which least degrade a performance caused by puncturing; a generate matrix generator for generating a generate matrix from the column permutated matrix; and an encoding calculator for encoding the input data according to the generate matrix.

The column permutated matrix generator may include; a puncturing bit calculating unit for calculating the number of bits to be punctured according to a maximum code rates among required code rates; a punctured bit position determining unit for determining the number of columns to be permutated according to the calculated number of bits and determining the determined number of columns degrading least performance caused by puncturing as columns to be replaced; and a column replacing unit for orderly replacing the determined columns.

The punctured bit position determining unit may determine a column where one variable node is punctured among a plurality of variable nodes connected to one check node on a factor graph according to a characteristic of a low density parity check code as the column to be punctured.

In accordance with still another aspect of the present invention, there is provided an apparatus for receiving data coded by a low density parity check code, including: a fast transformer for receiving a signal transmitted from a transmitting side and fast-fourier transforming the received signal; a bit inserter for inserting intermediate values in the transformed signal as many as the number of bits punctured in the transmitting side; a low density parity check decoder for decoding the bit-inserted signal based on an encoding method of a low density parity check encoder in the transmitting side; and a de-scrambler for generating final output data by de-scrambling the decoded signal.

In accordance with still another aspect of the present invention, there is provided an apparatus for receiving data coded by a low density parity check code, including: a bit inserter for inserting bits to corresponding punctured position as many as the number of bits punctured at a transmitting side according to a code rate of a receiving data; and a low density parity check decoder for performing a low density parity check decoding based on a low parity check code in which columns are permutated in an order of columns which least degrade a performance caused by puncturing.

The apparatus of claim may further include: a receiving antenna for receiving the signal transmitted from the transmitting side; and an analog-to-digital converter for converting the received analog signal to a digital signal.

The bit-inserter may insert corresponding number of bits in columns orderly from left side column in data inputted to the low density parity check decoder.

The low density check decoder may include: a soft decision unit for performing soft decision for a signal of the bit-inserted data by the bit inserter; and an LLR decoder for decoding the soft-decided signal based on a low density parity check code.

The low parity check decoder may further include: a parity check matrix generator for generating an M×N parity check matrix having a lesser number of 1's among elements of 0 or 1; and a column permutated matrix generator for generating a column permutated matrix by permuting columns of the parity check matrix according to an order of columns which least degrade a performance caused by puncturing.

The column permutated matrix generator may include; a puncturing bit calculating unit for calculating the number of bits to be punctured according to a maximum code rates among required code rates; a punctured bit position determining unit for determining the number of columns to be permutated according to the calculated number of bits and determining the determined number of columns degrading least performance caused by puncturing as columns to be replaced; and a column replacing unit for orderly replacing the determined columns.

The punctured bit position determining unit may determine a column where one variable node is punctured among a plurality of variable nodes connected to one check node on a factor graph according to a characteristic of a low density parity check code as the column to be punctured.

In accordance with still another aspect of the present invention, there is provided a method for transmitting data coded by a low density parity check code, including: encoding input data by a low density parity check code; and puncturing the encoded data in an order of columns which least degrade a performance caused by puncturing in the low density parity check code.

The encoding may further include permuting columns in the low density parity check code according to an order of columns which least degrade a performance caused by puncturing.

The permuting columns, columns which least degrade a performance caused by puncturing may be orderly replaced with one from a left side column to a right side column, or one from the right side column to the left side column.

The puncturing, bits may be punctured according to a code rate of the output data orderly from a left side column in the low density parity check code.

The encoding input data may include: generating an M×N parity check matrix having a lesser number of 1's among elements of 0 and 1; generating a column permutated matrix by permuting columns of the parity check matrix according to an order of columns which least degrade a performance caused by puncturing; generating a generate matrix from the column permutated matrix; and encoding the input data according to the generate matrix.

The generating the column permutated matrix may include: calculating the number of bits to be punctured according to a maximum code rates among required code rates; determining the number of columns to be permutated according to the calculated number of bits and determining the determined number of columns degrading least performance caused by puncturing as columns to be replaced; and orderly replacing the determined columns.

In the determining the number of columns, a column where one variable node may be punctured among a plurality of variable nodes connected to one check node on a factor graph according to a characteristic of a low density parity check code is determined as the column to be punctured.

The determining the number of columns may include: selecting a column having least number of 1's in a low density parity check matrix; analyzing rows of 1's in the selected column; and determining a $j^{th}$ column as a candidate column to be punctured if the $j^{th}$ column satisfies a predetermined condition in a case that the $j^{th}$ column is the selected column, wherein the condition is that there is at least one of the rows of 1's having non-punctured columns of non-zero elements.

In the determining the number of columns, the $j^{th}$ column may be determined as a column to be punctured if $0^{th}$ to $(j-1)^{th}$ columns satisfy with the predetermined condition.

In accordance with still another aspect of the present invention, there is provided a method for receiving data coded by a low density parity check code, including: inserting bits to corresponding punctured position as many as the number of bits punctured at a transmitting side according to a code rate of a receiving data; and performing a low density parity check decoding based on a low parity check code in which columns are permutated in an order of columns which least degrade a performance caused by puncturing.

In the inserting bits, corresponding number of bits may be inserted in columns orderly from left side column in data inputted to the low density parity check decoder.

The performing the low density parity check decoding may include: performing soft decision for a signal of the bit-inserted data by the bit inserter; and decoding the soft-decided signal based on a low density parity check code.

The performing the low parity check decoding may further include: generating an M×N parity check matrix having a lesser number of 1's among elements of 0 or 1; and generating a column permutated matrix by permuting columns of the parity check matrix according to an order of columns which least degrade a performance caused by puncturing.

The generating the column permutated matrix may include: calculating the number of bits to be punctured according to a maximum code rates among required code rates; determining the number of columns to be permutated according to the calculated number of bits and determining the determined number of columns degrading least performance caused by puncturing as columns to be replaced; and orderly replacing the determined columns.

In the determining the number of columns, a column where one variable node may be punctured among a plurality of variable nodes connected to one check node on a factor graph according to a characteristic of a low density parity check code is determined as the column to be punctured.

The determining the number of columns may include: selecting a column having least number of 1's in a low density parity check matrix; analyzing rows of 1's in the selected column; and determining a $j^{th}$ column as a candidate column to be punctured if the $j^{th}$ column satisfies a predetermined condition in a case that the $j^{th}$ column is the selected column, wherein the condition is that there is at least one of the rows of 1's having non-punctured columns of non-zero elements.

The determining the number of columns, the $j^{th}$ column may be determined as a column to be punctured if $0^{th}$ to $(j-1)^{th}$ columns satisfy with the predetermined condition.

BRIEF DESCRIPTION OF THE DRAWINGS

The above and other aspects the present invention will be more apparent by describing exemplary embodiments of the present invention with reference to the accompanying drawings, in which.

DETAILED DESCRIPTION OF THE EXEMPLARY EMBODIMENTS

Figure 1:
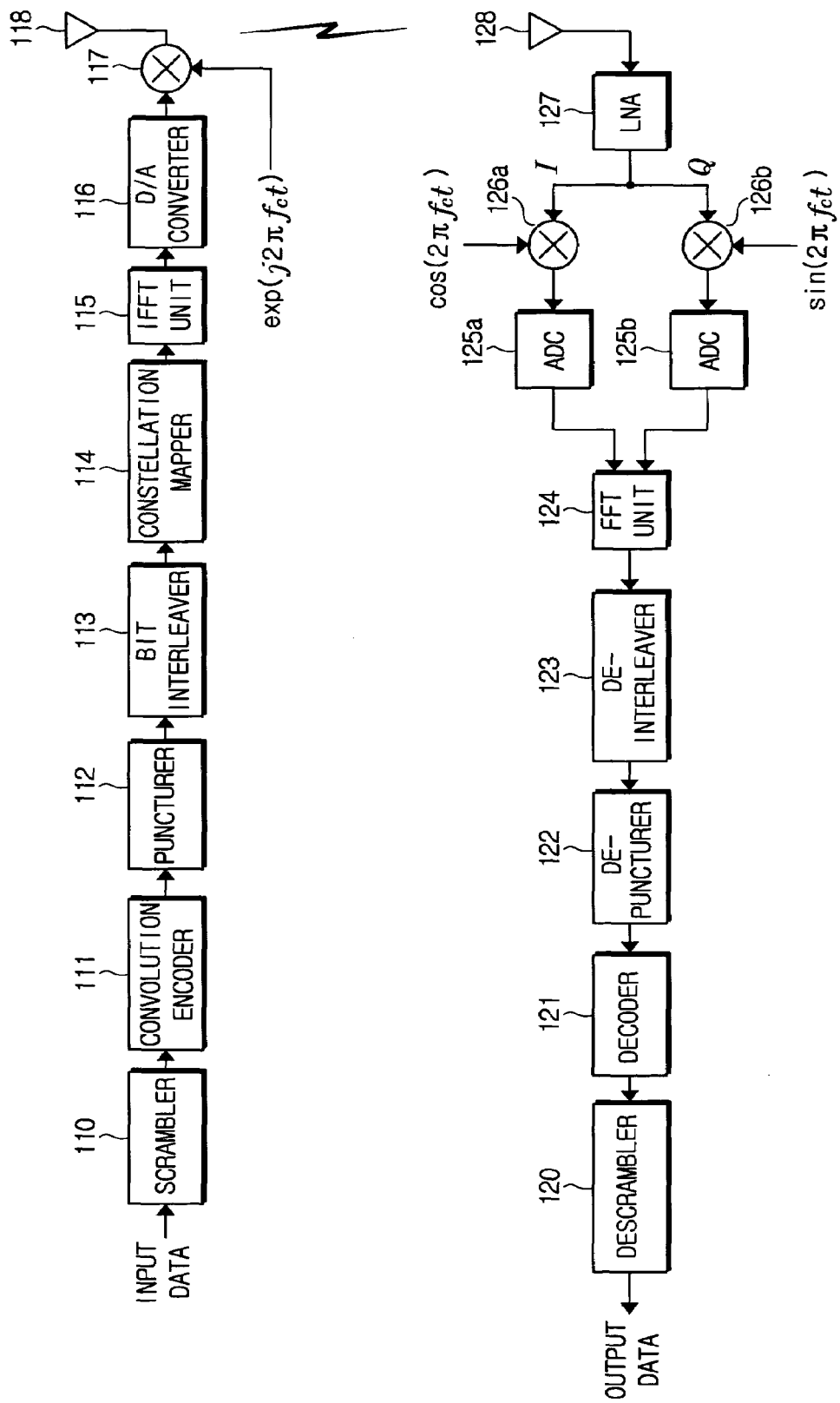
FIG. 1 is a block diagram illustrating a conventional multi-band OFDM system using convolution coder.
Figure 2:
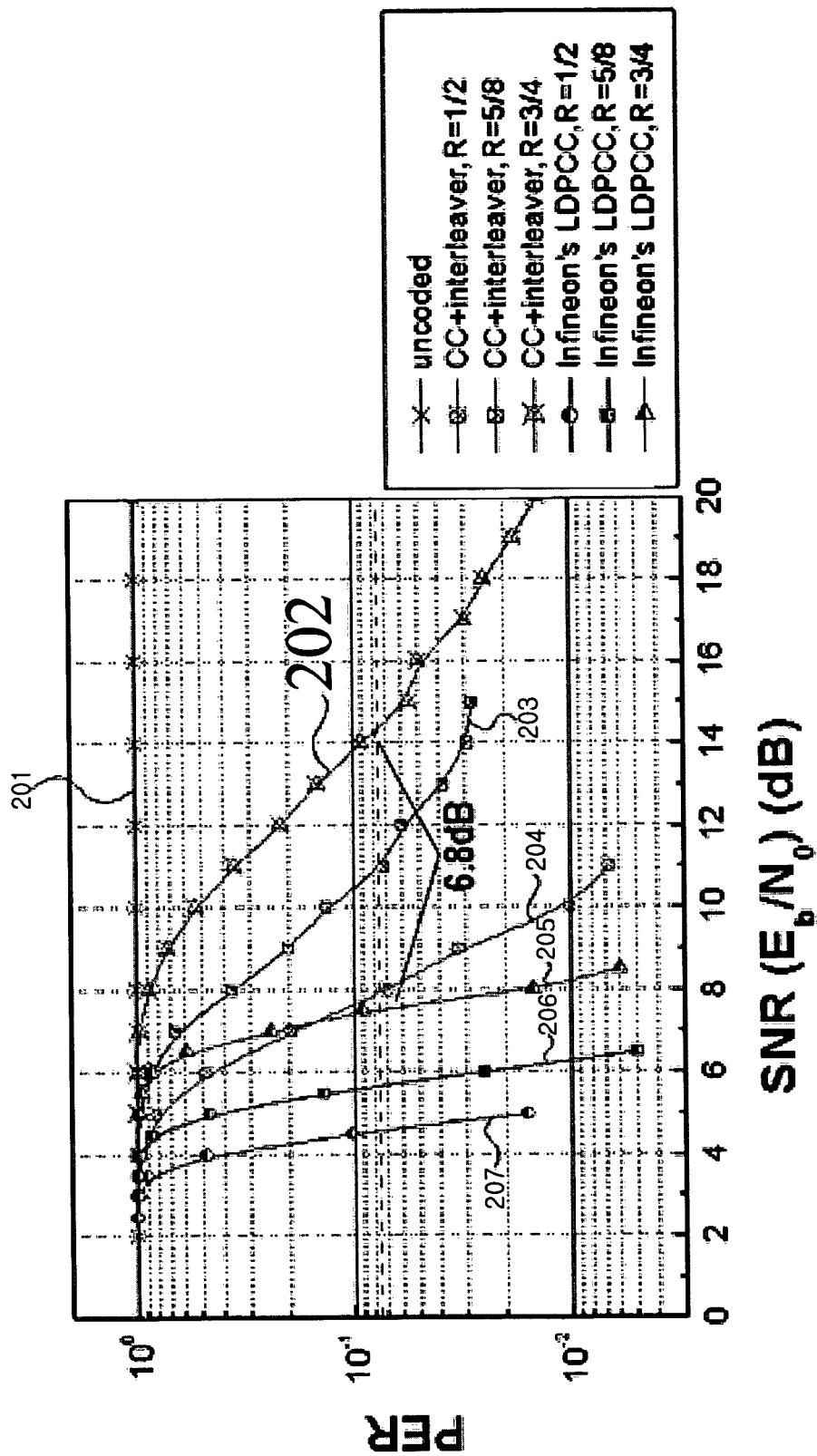
FIG. 2 is a graph showing a performance difference between a convolution coding and an LDPC coding.

Exemplary embodiments of the present invention will be described in greater detail with reference to the accompanying drawings.

In the following description, same drawing reference numerals are used for the same elements even in different drawings. The matters defined in the description such as a detailed construction and elements are provided to assist in a comprehensive understanding of the invention. Thus, it is apparent that the present invention can be carried out without those defined matters. Also, well-known functions or constructions are not described in detail since they would obscure the invention in unnecessary detail.

An apparatus and a method for encoding data by using an LDPC code in a system supporting various code rates are provided. As described above, different LDPC codes were conventionally used according to each of a plurality of code rates for supporting various code rates in the case of using the LDPC codes, thereby resulting in high complexity. Also, LDPC coded data is punctured according to each code rate for providing various code rates. It also causes performance degradation as compared to a performance of LDPC code before performing the puncturing when a conventional random puncturing method is used.

Accordingly, in order to prevent performance degradation caused by puncturing the LDPC coded data, a transmission apparatus and a method of the present invention firstly punctures a bit which is easy recover at a receiving side. Therefore, the present invention does not increase complexity and provides superior performance.

For determining a location of a bit to be punctured, a characteristic of the LDPC code must be known. Therefore, the LDPC code will be explained hereinafter to assist understanding the present invention in more detail.

The LDPC code is defined by a parity check matrix constructed with values of 0 and 1. Almost elements of the parity check matrix are 0.

The LDPC encoding scheme is a block encoding scheme. Predetermined data I is coded by using a generative matrix G. Coded data C is expressed as following equation 1.

$$I \cdot G = C \qquad \text{Equation 1}$$

The coded data C is decoded by computing with a parity check matrix H. If a result of computation is 0, it is determined that there is no error for decoding the coded data C as shown in following Equation 2

$$H \cdot C = 0, \forall C \qquad \text{Equation 2}$$

Accordingly, the LDPC code is defined as the parity check matrix H and a computation complexity of the LDPC encoding is also decided by the parity check matrix H.

For example, (N, j, k) LDPC code represents a length N of a linear block code defined by a sparse structure of the parity check matrix having j elements having values of 1 in each column, k elements having values of 1 in each row and other elements having values of 0.

The LDPC code can be decoded by using an iterative decoding algorithm based on a sum-product algorithm in a factor graph. By using the iterative decoding algorithm based on the sum-product algorithm, a decoder of the LDPC code has lower complexity as compared to a decoder using a turbo encoder and can be easily embodied as a parallel processing decoder.

When the LDPC code is expressed as the factor graph, there is a cycle shown in the factor graph. It is widely known that repeated codes in the LDPC factor graph having the cycle is sub-optimal. Also, it was demonstrated that the LDPC code has superior performance from the repeated code. However, if there are many cycles having short length on the factor graph of the LDPC code, there is performance degradation of LDPC code performance. Therefore, there are many studies in progress for designing the LDPC code to not produce cycles with short length in the factor graph of the LDPC code.

For not producing the cycles with short length, a parity check matrix having low weight density is designed for the LDPC code to improve the decoding performance instead of the conventional generate matrix. The weight is the number of elements having a value of not 0 among elements constructing the conventional generate matrix and the parity check matrix.

If the parity check matrix regularly has j weights in each column and k weights each row, it is called a regular LDPC code, wherein the j and k are positive integer numbers. On the other hand, if the parity check matrix has an irregular number of weights in each of columns and rows, it is called an irregular LDPC code. Generally, the irregular LDPC code has better performance as compared to the regular LDPC code. However, the number of weights in the columns and the rows must be properly controlled for obtaining superior performance in the case of the irregular LDPC code since the number of the weights is not regular.

Conditions for guaranteeing superior performance of each bit of the LDPC code are explained as follows.

(1) A cycle in the factor graph of the LDPC code must be considered.

The cycle represents a loop constructed by edges connecting a variable node and a check node in the factor graph of the LDPC code. The length of the cycle is defined as the number of edges constructing the loop. Accordingly, a long length of the cycle represents that there are many edges connecting the variable node and the check node for constructing the loop in the factor graph. On the other hand, a short length of the cycle means that there are few edges connecting the variable node and the check node for constructing the loop in the factor graph.

The LDPC code performance is proportional to the length of the cycle in the factor graph of the LDPC code. That is, if the cycle is formed in the factor graph to have a longer length of cycle, the LDPC code has better performance. When the cycle is generated to have a short length, there is an error floor generated and it degrades the performance of the LDPC code. However, when the cycle is generated to have the longer length, the error floor is not generated.

(2) A bit having higher order in the factor graph of the LDPC code has superior performance.

Generally, the bit having high order has better performance than a bit having lower order. It is because the high order bit can be recovered by other bits connected with edge based on the repeat decoding. The order represents the number edges connected to the variable nodes and the check nodes in the factor graph of the LDPC code. An order distribution in the factor graph of the LDPC code represents a ratio of nodes having a predetermined order among entire nodes in the factor graph of the LDPC code.

Accordingly, the present invention determines columns of the parity check matrix of the LDPC code which would least degrade performance if the column is punctured and the determined columns are permuted with predetermined columns for firstly puncturing bit locations which are proper for signal recovery in the receiver side. That is, the determined column is replaced with a first column, input data is encoded and the first column is firstly punctured according to corresponding code rate for obtaining various code rates and simultaneously preventing performance degradation caused by the puncturing.

Figure 3:
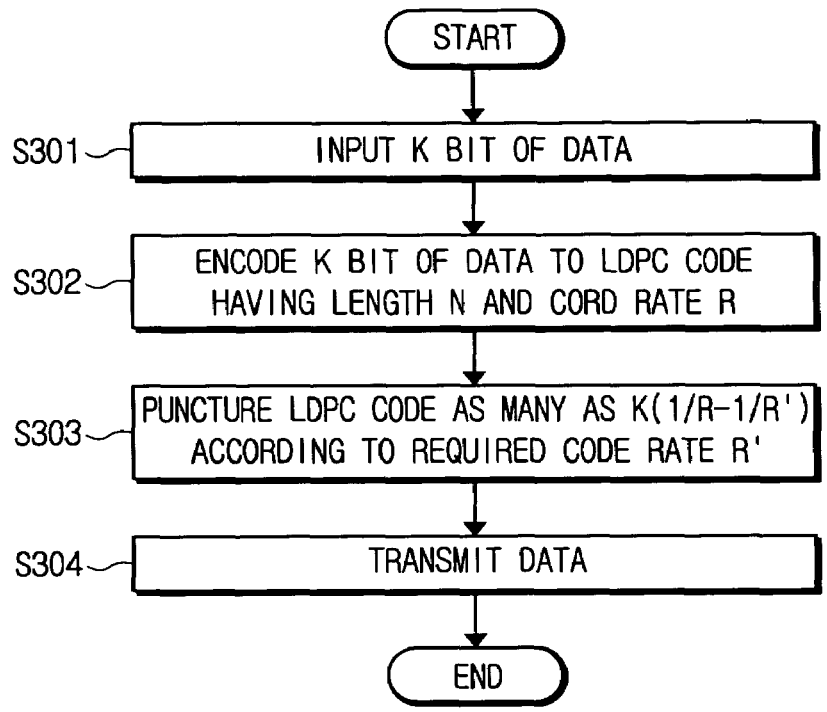
FIG. 3 is a flowchart showing a method for transmitting data coded by an LDPC coder supporting various code rates in accordance with an exemplary embodiment of the present invention.

FIG. 3 is a flowchart showing a method for transmitting data coded by an LDPC coder supporting various code rates in accordance with an exemplary embodiment of the present invention. Referring to FIG. 3, the LDPC coder receives k bits of data to be transmitted to a receiving side at operation S301. The input data is encoded to an LDPC code having a code length N and a code rate R at operation S302. The LDPC code is generated by determining a column degrading least performance if the column is punctured and replacing the determined column to a position to be punctured. The column permutation will be explained in detail later.

After encoding, the LDPC coded input data is punctured as many as a predetermined bits, i.e., K(1/R-1/R'), according to a required code rate R' at operation S303. The punctured LDPC coded input data is transmitted at operation S304.

Figure 4:
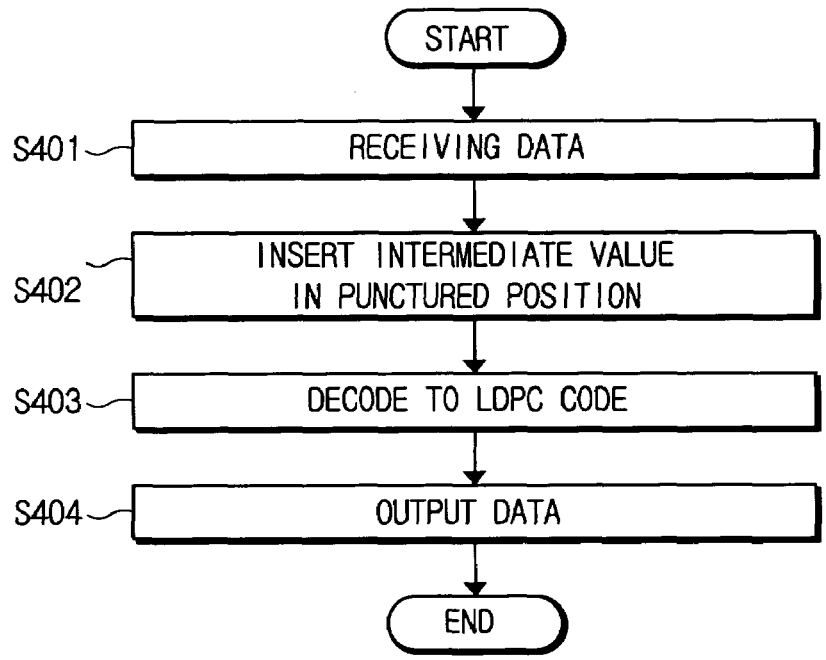
FIG. 4 is a flowchart showing a method for receiving the LDPC coded data transmitted by an LDPC coder supporting various code rates in accordance with an exemplary embodiment of the present invention.

FIG. 4 is a flowchart showing a method for receiving the LDPC coded data transmitted by an LDPC coder supporting various code rates in accordance with an exemplary embodiment of the present invention. As shown in FIG. 4, a receiver receives the LDPC coded data from the transmitting side as shown in FIG. 3 at operation S401. The receiver inserts an intermediate value of a bit in the punctured bit location at operation S402. The bit inserted received data is decoded to an LDPC code at operation S403 and k bits of data is output at operation S404.

Since the position to be punctured is punctured with a bit which least influences to performance degradation at the transmitting side, there is no performance degradation problem in the receiver side if the received data is decoded by inserting intermediate value of bit at the location to be punctured.

Hereinafter, a multiband OFDM system with an LDPC coding scheme of the present invention will be explained.

Figure 5:
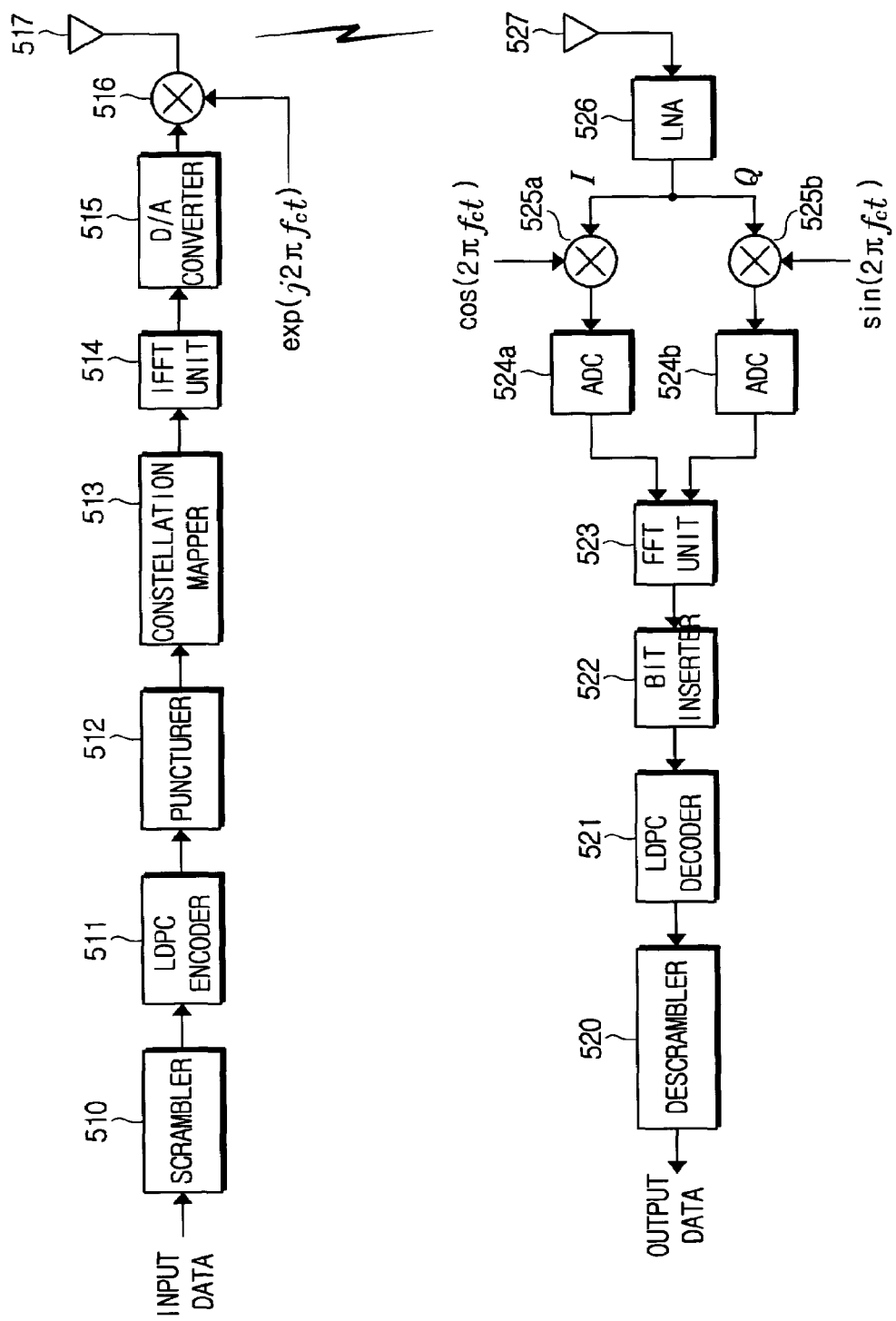
FIG. 5 is block diagram illustrating a multiband OFDM system using an LDPC coder in accordance with an exemplary embodiment of the present invention.

FIG. 5 is block diagram illustrating a multiband OFDM system using an LDPC coder in accordance with an exemplary embodiment of the present invention. Referring to FIG. 5, the multiband OFDM system includes a transmitter and a receiver. The transmitter includes a scrambler 510, an LDPC coder 511, a puncturer 512, a constellation mapper 513, an IFFT unit 514, a D/A converter 515, a multiplier 516 and a transmitting antenna 517. The input data is scrambled by the scrambler 510 and the LDPC encoder 511 encodes the scrambled data. The LDPC encoder 511 determines a column generating least performance degradation when it is punctured and replaces the determined column with a row to be punctured. After replacing, the puncturer 512 punctures the LDPC coded data according to code data to be transmitted.

The punctured data is converted to a symbol by the constellation mapper 513 and inverse fast fourier transformed by the IFFT unit 514. Next, the transformed data is converted to analog signal by the D/A converter 515 and the analog signal is multiplied with carrier frequency signal $\exp(j2\pi f_c t)$ by the multiplier 516. The multiplied signal is transmitted through the transmitting antenna 517 to the receiver.

The receiver receives the LDPC coded signal from the transmitter and processes the LDPC coded signal in an order opposite to the processing in the transmitter. The receiver includes a descrambler 520, an LDPC decoder 521, a de-puncturer 522, an FFT unit 523, two A/D converters 524*a*, 524*b*, two multipliers 525*a*, 525*b*, an LNA 526, and a receiving antenna 527. The LNA 526 receives a signal transmitted from the transmitting unit through the antenna 527 and amplifies the received signal. The two multipliers 525*a* and 525*b* divide the received signal into an I-channel signal and a Q-channel signal and the A/D converters 524*a* and 524*b* convert the I-channel signal and the Q-channel signal to digital signals.

The digital signal is fast fourier transformed by the FFT unit 523 and the de-puncturer 522 inserts an intermediate value for each of the punctured bits. The LDPC decoder 521 decodes the bit inserted data and the decoded data is descrambled for generating final output data.

As described above, in the present invention, the LDPC coded data is transmitted by puncturing the LDPC coded data for reducing complexity. Therefore, a multiband OFDM system can be embodied to have low complexity according to the present invention. Also, the bit generating least performance degradation is punctured in the present invention. Therefore, the LDPC coder having superior performance can be used for the transmitting apparatus supporting various code rates.

Hereinafter, a detailed structure of the LDPC encoder 511 and the LDPC decoder 521 and a method for determining a location to be punctured are explained by referring to FIGS. 6 to 10.

Figures 6, 7:
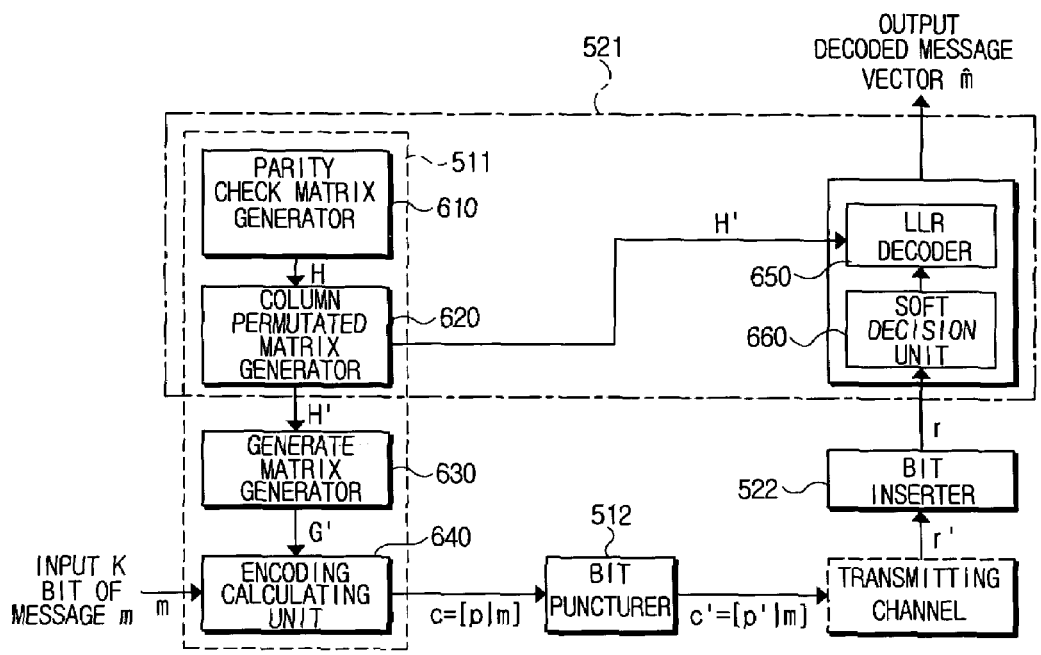
FIG. 6 is a block diagram illustrating the LDPC encoder and the LDPC decoder in accordance with an exemplary embodiment of the present invention.
FIG. 7 is a view showing a generated parity check matrix H.

FIG. 6 is a block diagram illustrating the LDPC encoder and the LDPC decoder in accordance with an exemplary embodiment of the present invention. Referring to FIG. 6, the LDPC encoder 521 includes a parity check matrix generator 610, a column-permutated matrix generator 620, a generate matrix generator 630 and an encoding calculator 640. The LDPC decoder 521 includes an LLR decoder 650 and a soft-decision unit 660.

The parity check matrix generator 610 generates M×N matrix H having values of 0 and 1. The parity check matrix mostly has values of 0. The generated parity check matrix H is shown in FIG. 7.

Referring to FIG. 7, each element of the parity check matrix is 0 or 1 and the parity check matrix includes M columns and N rows. The size of N represents a length of codeword to be coded and a size of M represents the number of parity bit.

Column of the parity check matrix H generated by the parity check matrix generator 610 is permutated by the column-permutated matrix generator 620 according to a selection of columns to be punctured. That is, the column-permutated matrix generator 620 generates the column permutated matrix H' as shown in FIG. 8.

Figures 8, 9:
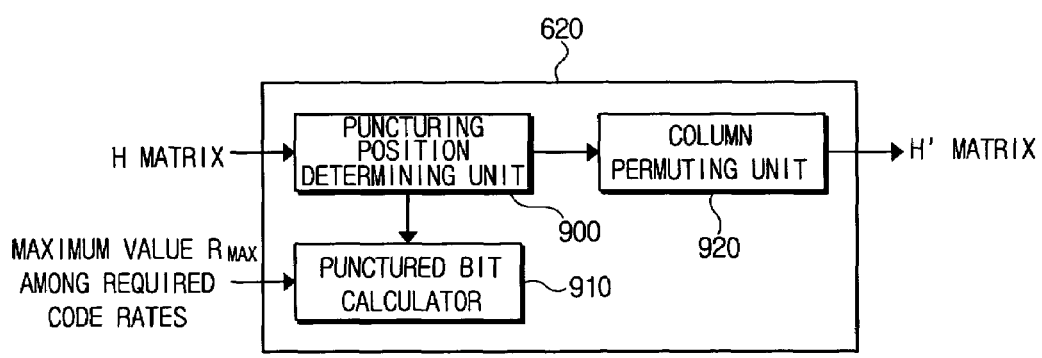
FIG. 8 is a diagram showing a column permutated parity check matrix in accordance with an exemplary embodiment of the present invention.
FIG. 9 is a block diagram showing a column permutated matrix generator in accordance with an exemplary embodiment of the present invention.

Referring to FIG. 8, according to a code rate to be transmitted, the number of columns to be punctured Np is determined and Np columns, which will least influence the performance if the columns are punctured, are selected. The selected Np columns are permutated with columns in the left side.

A method for replacing the columns may be modified according to a method for puncturing. That is, the selected columns become columns to be firstly punctured.

Preferably, but not necessarily, the columns are replaced in an order of least influencing the performance degradation with the columns in the left side of the matrix. Accordingly, the bit puncturer firstly punctures the most left column according to the code rate to be transmitted. In the receiver, a bit is inserted from the most left side column. Therefore, the present invention does not require transmitting/receiving information for location to be punctured.

In another embodiment, the columns to be punctured are replaced with the most right side columns in the matrix and then the columns are punctured in an order from the most right side columns to left side column. In still another embodiment, the column permutation is not performed and information about location of columns to be punctured is stored. In this embodiment, the bit puncturer punctures the columns according to the information. However, in this embodiment, the receiver must be informed the location to be punctured. That is, information must be transmitted to the receiver.

The generate matrix generator 630 generates the generate matrix based on the column permutated matrix from the column permutated matrix generator 620. The generate matrix generator 630 determines a K×NG' matrix, which is called as the generator matrix G'.

$$H' \cdot G' = 0 \qquad \text{Equation 3}$$

The encoding calculator 640 encodes K bits of message vector m based on the generate matrix G'.

If the inputted message vector m=[m0, m1, ..., mk−1], the generated codeword C is expressed as follows in Equation 4.

$$c = [p \mid m] = [p_0 p_1 \ldots p_{N_{PMAX}-1} p_{N_{PMAX}} \ldots p_{M-1} \bigstar \\ m_0 m_1 \ldots m_{k-1}] \qquad \text{Equation 4}$$

In Equation 4, p is a parity part and m represents a message part.

If the required code rate is R' and a bit to be punctured is Np, the codeword C is punctured from Np and a result of puncturing the codeword C is shown as follows.

$$c' = [p' \mid m] = [p_{N_P} \ldots p_{M-1} \mid m_0 m_1 \ldots m_{k-1}] \qquad \text{Equation 5}$$

As shown in FIG. 6, the punctured data C' is transmitted to the receiver through a transmitting channel and it becomes a signal r'. The signal r' is expressed as follows in Equation 6.

$$r' = \lfloor \tilde{p}' \mid \tilde{m} \rfloor = \lfloor \tilde{p}_{N_P} \ldots \tilde{p}_{M-1} \mid \tilde{m}_0 \tilde{m}_1 \ldots \tilde{m}_{K-1} \rfloor \qquad \text{Equation 6}$$

The de-puncturer 522 inserts an intermediate value e to a punctured position and accordingly, the signal r' is changed to r expressed as follows in Equation 7.

$$r = \lfloor \tilde{p} \mid \tilde{m} \rfloor = \lfloor e \ldots e \tilde{p}_{N_P} \ldots \tilde{p}_{M-1} \mid \tilde{m}_0 \tilde{m}_1 \ldots \tilde{m}_{K-1} \rfloor \qquad \text{Equation 7}$$

As mentioned above, the bit inserted receiving data r is processed by the soft decision unit 660 and the LLR decoder 650 decodes the processed receiving data r based on a log-likelihood ratio belief-propagation (LLR-BP).

Finally, the receiver outputs the decoded data as a message vector $\hat{m}$ as follows in Equation 8.

$$\hat{m} = [\hat{m}_0 \hat{m}_1 \ldots \hat{m}_{K-1}] \qquad \text{Equation 8}$$

FIG. 9 is a block diagram showing a column permutated matrix generator in accordance with an exemplary embodiment of the present invention. Referring to FIG. 9, the column permutated matrix generator 620 includes a puncturing position determining unit 900, a punctured bit calculator 910 and a column permuting unit 920.

As described above, the number of columns to be permutated and positions of the columns to be permutated must be calculated for generating the column permutated matrix.

Accordingly, the puncturing bit calculator 910 calculates the number of bits to be punctured according to the maximum code rate Rmax among require code rates. That is, as the code rate becomes higher, the number of bits to be punctured becomes larger.

Meanwhile, when the maximum code rate is Rmax, the number of bits to be punctured NP,MAX is calculated as follows in Equation 9.

$$N_{P,MAX} = K(1/R - 1/R_{MAX}) \qquad \text{Equation 9}$$

The puncturing position determining unit 900 determines the number of columns to be selected as columns to be permutated according to the number bits calculated by the puncturing bit calculating unit 910 and determines the columns least influencing performance degradation as the columns to be permutated. The column permuting unit 920 replaces the determined columns with the left most columns or the right most columns. By replacing the column, the column permutated matrix H' is generated.

Hereinafter, a method for determining a position of a column to be punctured will be explained. The position of column to be punctured must be a column degrading least performance even if the column is punctured and transmitted to the receiving side as mentioned above. Accordingly, a column must be selected where only one variable node is punctured among a plurality of variable nodes connected to one check node on the factor graph according to characteristics of the LDPC code as described above.

For determining a position of a column to be punctured, a column having least 1's is selected at the operation S1 and rows of 1's in the selected column are analyzed at operation S2.

After then, in the case that a column having least number 1's is a column j, if there is at least one row having non-punctured columns of non-zero elements among rows of 1's in the column j, the column j is decided as a candidate column to be punctured at operation S3.

If a condition of the operation S3 is satisfied by a column 0 to a column j−1 after the column j is punctured, the column j is finally decided as the column to be punctured.

The following examples are provided for helping to understand the present invention.

Table 1 represents elements of the parity check matrix as a table format.

TABLE 1

|   | X | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|----|----|----|----|----|----|----|----|----|----|
| 0 |   |   |   |   |   |   |   |   |   |   |    | 1  |    | 1  |    | 1  |    | 1  |    |    |
| 1 |   |   |   | 1 | 1 |   |   |   |   |   |    | 1  |    |    |    |    | 1  |    |    |    |
| 2 |   |   | 1 |   | 1 | 1 |   |   |   |   |    |    |    |    | 1  |    |    |    |    |    |
| 3 |   |   | 1 |   |   |   |   | 1 |   |   |    |    |    |    |    |    | 1  | 1  |    |    |
| 4 |   | 1 |   |   |   |   |   | 1 | 1 | 1 |    |    |    |    |    |    |    |    |    |    |
| 5 |   |   |   |   |   |   |   | 1 |   |   |    |    |    |    | 1  | 1  |    |    |    | 1  |
| 6 |   |   |   |   |   |   |   |   |   |   |    |    |    |    |    |    |    |    |    |    |
| 7 |   |   |   |   |   |   |   |   |   |   |    |    |    |    |    |    |    |    |    |    |
| 8 |   |   |   |   | 1 |   |   |   |   |   |    | 1  | 1  |    | 1  |    |    |    |    |    |
| 9 |   | 1 |   |   |   |   |   |   |   |   |    | 1  |    | 1  | 1  |    |    |    |    |    |

Table 1 represents a regular LDPC code having two 1's in each column. At first, a column 0 is analyzed to determine whether the column 0 is a column to be punctured. As described above, positions of 1's in the column 0 are rows 6 and 7. Since there is at least one row having all columns having non-zero elements which are not punctured, the column 0 is determined as a candidate column to be punctured.

After then, a column 1 is analyzed as shown in below table.

TABLE 2

|   | X | X | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|----|----|----|----|----|----|----|----|----|
| 0 |   |   |   |   |   |   |   |   |   |   |    | 1  |    | 1  |    | 1  |    | 1  |    |    |
| 1 |   |   |   | 1 | 1 |   |   |   |   |   |    | 1  |    |    |    |    | 1  |    |    |    |
| 2 |   |   | 1 |   | 1 | 1 |   |   |   |   |    |    |    |    | 1  |    |    |    |    |    |
| 3 |   |   | 1 |   |   |   |   | 1 |   |   |    |    |    |    |    |    | 1  | 1  |    |    |
| 4 |   |   |   |   |   |   |   |   |   |   |    |    |    |    |    |    |    |    |    |    |
| 5 |   |   |   |   |   |   |   | 1 |   |   |    |    |    |    | 1  | 1  |    |    |    | 1  |
| 6 | 1 |   |   |   | 1 | 1 |   |   |   |   |    |    |    |    |    |    |    |    |    | 1  |
| 7 | 1 |   |   |   |   |   |   | 1 |   |   |    |    | 1  | 1  |    |    |    |    |    |    |
| 8 |   |   |   |   | 1 |   |   |   |   | 1 | 1  |    | 1  |    |    |    |    |    |    |    |
| 9 |   |   |   |   |   |   |   |   |   |   |    |    |    |    |    |    |    |    |    |    |

In the column 1, the row 4 and the row 9 are 1's. As described above, any one of columns of the row 4 and the row 9 is not punctured except the columns 4 and 9. Therefore, the column 1 is determined as the candidate column to be punctured. After deciding the column 1 as the candidate column, the column 0 is analyzed with same condition of the operation S3. If the column 0 satisfies the condition of the operation S3, the column 1 is finally decided as the column to be punctured.

The column 2 is identically analyzed as shown in below Table 3.

TABLE 3

| | X | X | X | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| 0 | | | | | | | | | | | | 1 | | 1 | | 1 | | 1 | | |
| 1 | | | | 1 | | 1 | | | | | | 1 | | | | | 1 | | | |
| 2 | | | | | | | | | | | | | | | | | | | | |
| 3 | | | | | | | | | | | | | | | | | | | | |
| 4 | | 1 | | | | | 1 | 1 | 1 | | | | | | | | | | | |
| 5 | | | | | | | | 1 | | | | | | | 1 | 1 | | | | 1 |
| 6 | 1 | | | 1 | 1 | | | | | | | | | | | | | | | 1 |
| 7 | 1 | | | | | 1 | | | | | | 1 | 1 | | | | | | | |
| 8 | | | | 1 | | | | | 1 | 1 | | 1 | | | | | | | | |
| 9 | | 1 | | | | | | | | 1 | | | 1 | 1 | | | | | | |

As shown, a row 2 and a row 3 in the column 2 include 1's. As mentioned above, the column 2 is determined as the candidate column since any of columns of the row 2 and the row 3 is not punctured except the column 2. Finally, the column 2 is decided as the column to be punctured because the column 0 and the column 1, which are already decided to be punctured, satisfy the condition of the operation S3 in a case that the column 2 will be punctured.

Columns 3 and 4 are determined as the column to be punctured based on the above mentioned method. However, a column 5 is determined as a column not to be punctured since the column 5 does not satisfy the condition in the operation S3 as shown in below Table 4.

TABLE 4

| | X | X | X | X | X | | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| 0 | | | | | | | | | | | | 1 | | 1 | | 1 | | 1 | | |
| 1 | | | | | | | | | | | | | | | | | | | | |
| 2 | | | | | | | | | | | | | | | | | | | | |
| 3 | | | 1 | | | | | 1 | | | | | | | | | | 1 | 1 | |
| 4 | | 1 | | | | | 1 | 1 | 1 | | | | | | | | | | | |
| 5 | | | | | | | 1 | | | | | | | | 1 | 1 | | | | 1 |
| 6 | 1 | | | 1 | 1 | | | | | | | | | | | | | | | 1 |
| 7 | 1 | | | | | | 1 | | | | | 1 | 1 | | | | | | | |
| 8 | | | | | 1 | | | | 1 | 1 | | 1 | | | | | | | | |
| 9 | | 1 | | | | | | | | 1 | | | 1 | 1 | | | | | | |

Referring to Table 4, rows 1 and 2 of the column 5 include 1's. The column 3 of the row 1 is already punctured and the column 2 of the row 2 is already punctured as shown in Table.

4. Accordingly, the column 5 may decrease performance if the column 5 will be punctured. Therefore, the column 5 is determined as a column not to be punctured.

If columns 6 to 19 are analyzed with the above mentioned method, the columns to be punctured are determined as shown in Table 5.

channel model: ultra wideband (UWB) channel (channel 1 to channel 3)

decode algorithm: a viterbi decoder for the CC, and an LLR-BP algorithm is used for the Infineon's LDPC code and the LDPC code of the present invention by setting the maximum iterations as 12.

TABLE 5

| | X | X | X | X | X | 5 | 6 | X | 8 | 9 | 10 | 11 | 12 | 13 | 14 | 15 | 16 | 17 | X | 19 |
|---|---|---|---|---|---|---|---|---|---|---|---|---|---|---|---|---|---|---|---|---|
| 0 | | | | | | | | | | | | 1 | | | 1 | | 1 | | 1 | |
| 1 | | | 1 | | 1 | | | | | | | 1 | | | | 1 | | | | |
| 2 | | 1 | | | 1 | 1 | | | | | | | | | 1 | | | | | |
| 3 | | | 1 | | | | | 1 | | | | | | | | | 1 | 1 | | |
| 4 | | 1 | | | | | | 1 | 1 | 1 | | | | | | | | | | |
| 5 | | | | | | | 1 | | | | | | | | | 1 | 1 | | | 1 |
| 6 | 1 | | | 1 | 1 | | | | | | | | | | | | | | | 1 |
| 7 | 1 | | | | | 1 | | | | | | | 1 | 1 | | | | | | |
| 8 | | | | 1 | | | | | | 1 | 1 | 1 | | | | | | | | |
| 9 | | 1 | | | | | | | | | 1 | | | 1 | 1 | | | | | |

Referring to Table 5, the columns 0, 1, 2, 3, 4, 7 and 18 are selected as the columns to be punctured.

Figure 10:
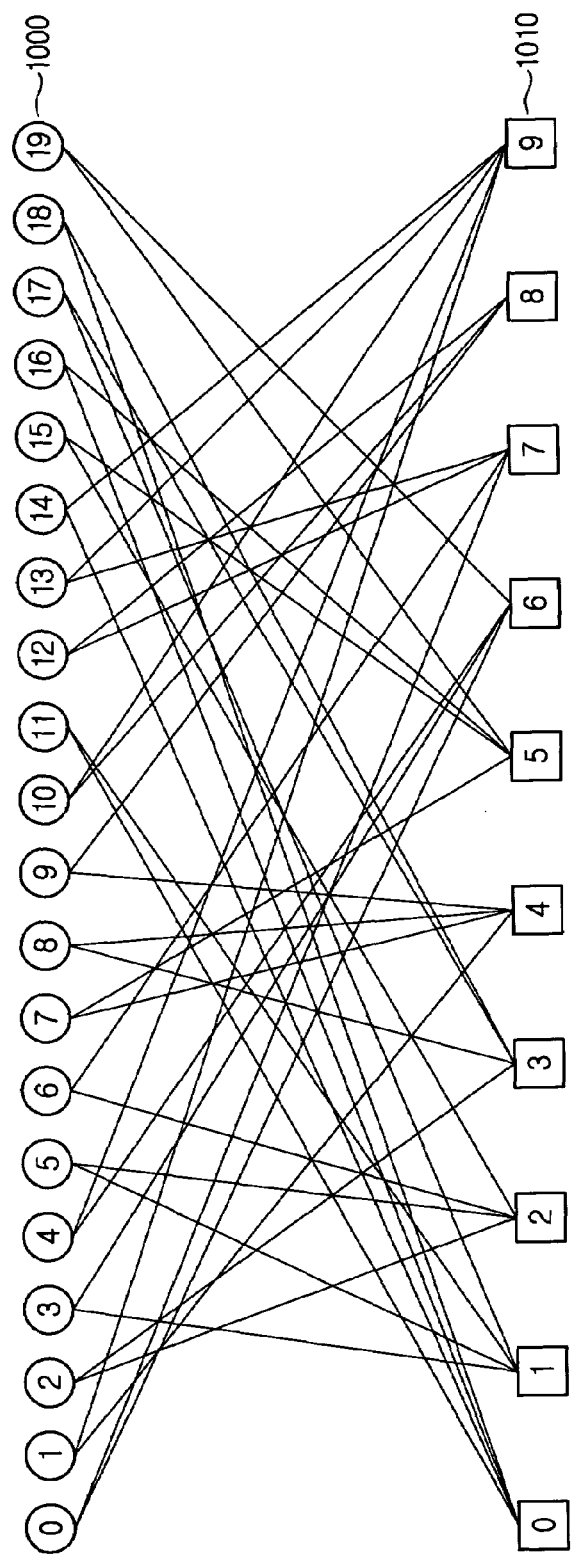
FIG. 10 is a factor graph for determining a puncturing position in accordance with an exemplary embodiment of the present invention.

The parity check matrix can be expressed as a factor graph of FIG. 10. It is clearly shown in the factor graph that the selected columns are columns which least degrade the performance even if the selected columns are punctured and transmitted.

FIG. 10 is a factor graph for determining a puncturing position in accordance with an exemplary embodiment of the present invention. Referring to FIG. 10, since the parity check matrix includes 10 rows and 20 columns, the parity check matrix can be expressed as a graph including 20 variable nodes 1000 connected to 10 check nodes 1010. In a case that '1' is in a point where each column and each row is met on the parity check matrix, the variable node and the check node is connected.

Meanwhile, if the columns 0, 1, 2, 3, 4, 7 and 18 are punctured, a reliability of a line connected to the variable nodes 0, 1, 2, 3, 4, 7, and 18 decreases. However, performance degradation during decode can be prevented since it is punctured for connecting check nodes connected to the variable nodes of the punctured columns to variable nodes of non-punctured columns in one-to-one manner.

Figure 11:
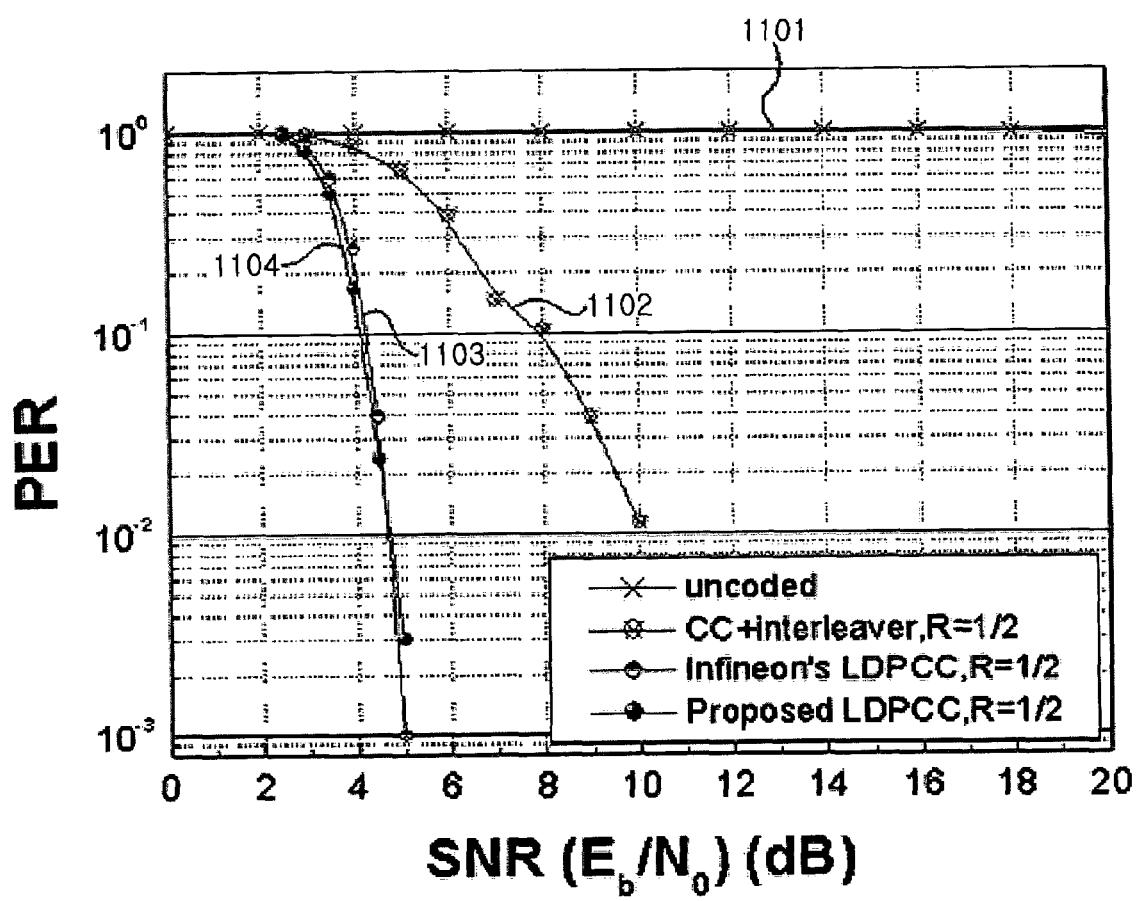
FIGS. 11 to 13 are graphs for comparing performances of LDPC code of the present invention and a conventional code.
Figure 12:
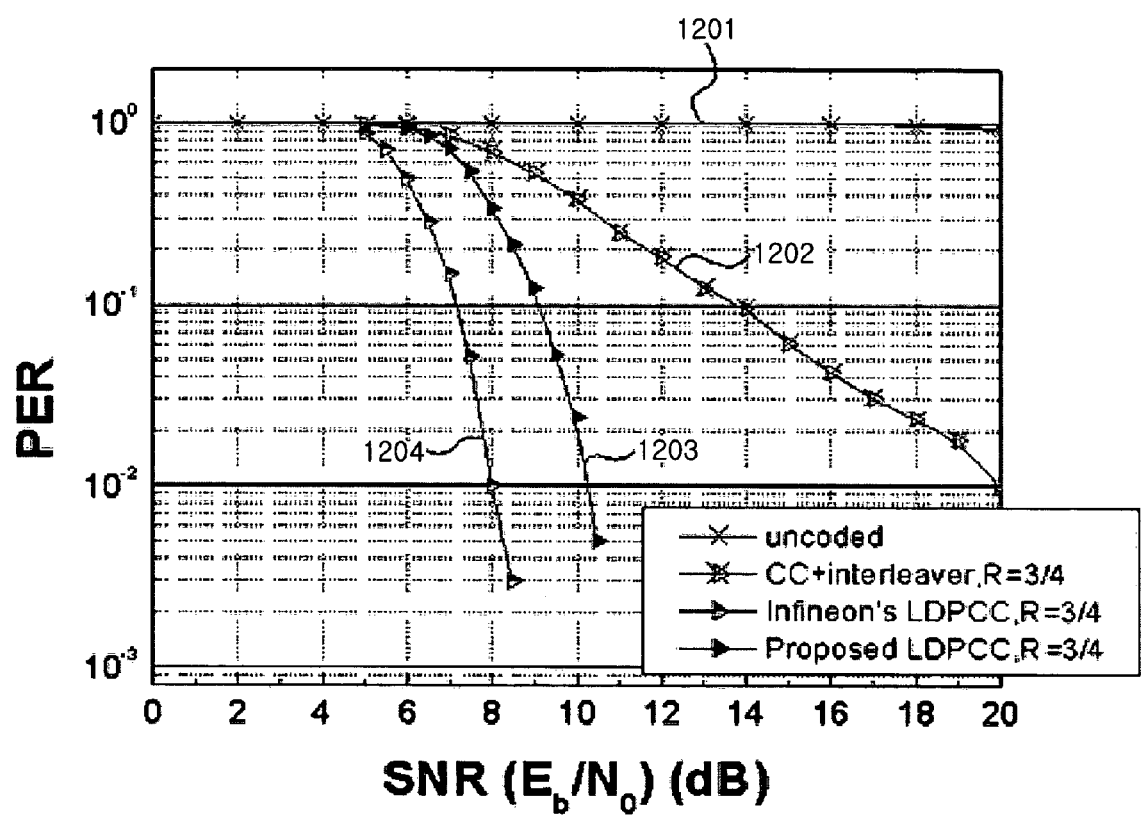
Figure 13:
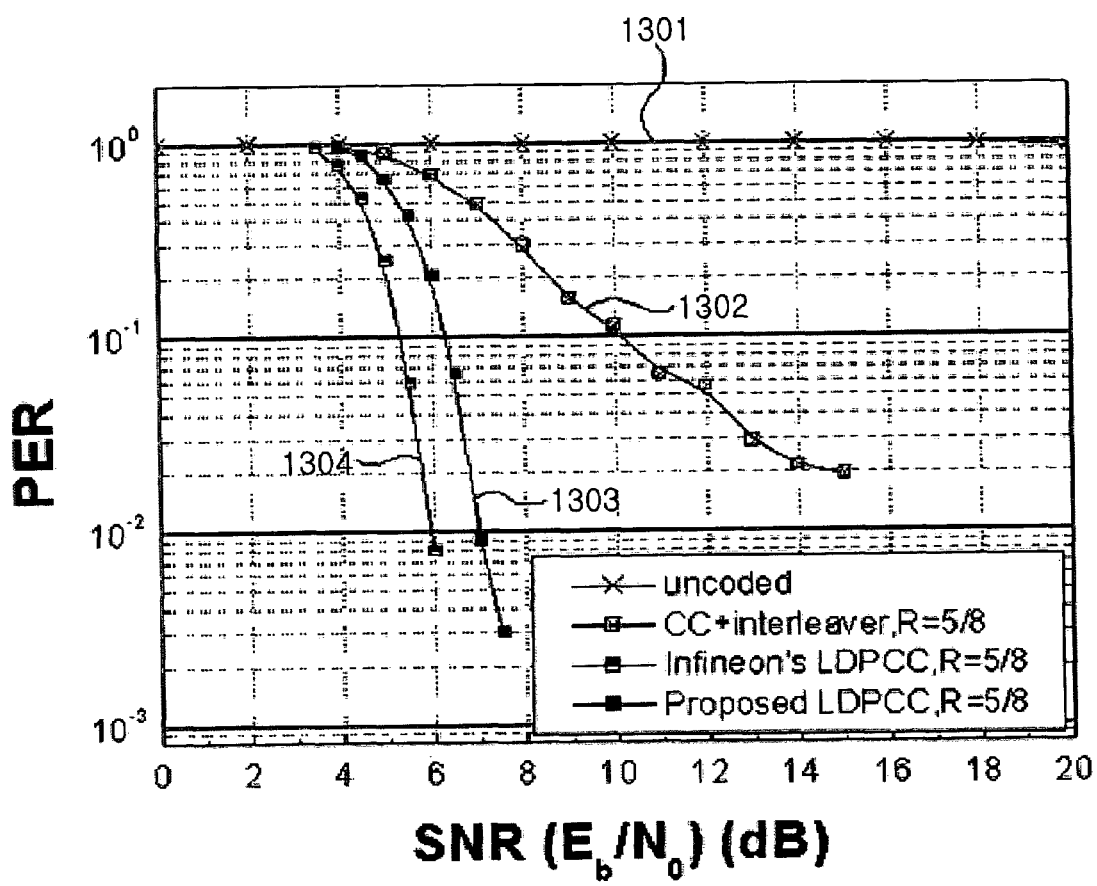

FIGS. 11 to 13 are graphs for comparing performances of LDPC code of the present invention and a conventional code.

FIG. 11 is a graph showing performances of conventional codes in an encode having a ½ code rate and the LDPC code of the present invention, FIG. 12 is a graph showing performances of conventional codes in an encode having a ¾ code rate and the LDPC code of the present invention and FIG. 13 is a graph showing performances of conventional codes in an encode having a ⅝ code rate and the LDPC code of the present invention.

Conditions of simulation to obtain the graphs are as follows:

object code: a convolution code (CC), an Infineon's LDPC code (LDPCC), an LDPC code of the present invention (proposed LDPCC)

additional conditions: complete carrier/time synch and complete channel estimation and non-linear elements such as DAC, ADC, RF are not considered. A cyclic-prefix is used. 1000 packets are transmitted per 1 PER point (8000 bits≦1 packet≦8400 bits).

Referring to FIG. 11, a curve 1101 represents a PER performance of non-encoded signal, a curve 1102 represents a PER performance of using the convolution code, a curve 1103 represents a PER performance of using a plurality of LDPC encoders which are not punctured and a curve 1104 represents a PER performance of using a punctured LDPC encoder of the present invention. As shown in FIG. 11, the encoding method 1104 provides better performance than the conventional encoding method 1102 using the convolution code. Also, the complexity of the LDPC encoder of the present invention decreases while providing identical performance as compared to the conventional LDPC encoding method 1103 using additional un-punctured mother code according to each code rate.

In a case of using ¾ or ⅝ code rates shown in FIGS. 12 and 13, the punctured LDPC encoder of the present invention provides superior performance as compared to the conventional encoders. Also, the performance of the present invention becomes closed to the conventional un-punctured LDPC code of high complexity.

Furthermore, it is obvious to those skilled in the art that the present invention can be effectively implemented to a UWB system and any systems using low density parity check code.

As describe above, the LDPC code providing superior performance can be implemented in the next generation mobile communication system supporting various code rates in accordance with the present invention.

Also, in the present invention, performance is dramatically improved as compared to the convolution code used in a conventional multi-band OFDM system and the performance is not degraded as compared to the conventional LDPC code method having high complexity.

Furthermore, when the convolution code is used, a bit interleaver is required but the bit interleaver is not required in the present invention since the LDPC code includes a bit interleaving function.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. An apparatus for transmitting data coded by a low density parity check code, the apparatus comprising:
    a low density parity check encoder which encodes input data based on the low density parity check code; and
    a bit puncturer which punctures data coded by a low density parity check code in an order of columns which reduces performance degradation caused by puncturing in the low density check code according to a code rate of output data,
    wherein the low density parity check encoder comprises:
    a parity check matrix generator which generates a parity check matrix based on the low density parity check code, the parity check matrix comprising a plurality of columns and a plurality of rows;
    a column permutated matrix generator which generates a column permutated matrix by permuting columns of the parity check matrix according to an order of columns which reduces performance degradation caused by puncturing;
    a generate matrix generator which generates a generate matrix from the column permutated matrix; and
    an encoding calculator which encodes input data according to the generate matrix.

2. The apparatus of claim 1,
    wherein the parity check matrix consists of elements of 0 and 1, wherein a number of 1's is less than a number of 0's.

3. The apparatus of claim 2, wherein the column permutated matrix generator comprises:
    a puncturing bit calculating unit which calculates a number of bits to be punctured according to a maximum code rate among a plurality of required code rates;
    a punctured bit position determining unit which determines a number of columns, among the plurality of columns, to be permutated according to the calculated number of bits and determines which columns, among the plurality of columns, reduce performance degradation caused by puncturing; and
    a column replacing unit which replaces columns which reduce performance degradation caused by puncturing with columns not determined to reduce performance degradation caused by puncturing.

4. The apparatus of claim 3, wherein the punctured bit position determining unit determines a column where one variable node is punctured among a plurality of variable nodes connected to one check node on a factor graph according to a characteristic of a low density parity check code as a column to be punctured.

5. An apparatus for transmitting data coded by a low density parity check code, the apparatus comprising:
    a low density parity check encoder which encodes input data based on the low density parity check code; and
    a bit puncturer which punctures data coded by a low density parity check code in an order of columns which reduces performance degradation caused by puncturing in the low density check code according to a code rate of output data,
    wherein the low density parity check encoder includes a column permuting unit which permute columns in an order of columns which reduces performance degradation caused by puncturing in the low density parity check code.

6. The apparatus of claim 5, wherein columns which reduce performance degradation caused by puncturing are permuted from a right side column or from a left side column in the low density parity check code.

7. The apparatus of claim 6, wherein the bit puncturer punctures bits according to a code rate of the output data in an order from a left side column in the low density parity check code.

8. An apparatus of receiving data coded by a low density parity check code, the apparatus comprising:
    a bit inserter which inserts bits at a corresponding punctured position as many as the number of bits punctured at a transmitting side according to a code rate of a receiving data punctured in order from columns in which performance degradation caused by puncturing is reduced; and
    a low density parity check decoder which performs a low density parity check decoding of the data output by the bit inserter based on a low parity check code in which columns are permutated in an order of columns which reduced performance degradation caused by puncturing.

9. The apparatus of claim 8, wherein the bit-inserter inserts a corresponding number of bits in columns in an order from a left side column in data which is input to the low density parity cheek decoder.

10. The apparatus of claim 8, wherein the low density check decoder comprises:
    a soft decision unit which performs a soft decision for a signal of bit-inserted data output by the bit inserter; and
    an LLR decoder for decoding a soft-decided signal output by the soft decision unit based on a low density parity check code.

11. The apparatus of claim 8, wherein the low parity check decoder further comprises:
    a parity check matrix generator which generates a parity check matrix comprising a plurality of columns and a plurality of rows, and having elements of 0 and 1, wherein a number of 1's is less than a number of 0's; and
    a column permutated matrix generator which generates a column permutated matrix by permuting columns of the parity check matrix according to an order of columns which reduced performance degradation caused by puncturing.

12. The apparatus of claim 8, wherein the column permutated matrix generator comprises:
    a puncturing bit calculating unit which calculates a number of bits to be punctured according to a maximum code rate among a plurality of required code rates;
    a punctured bit position determining unit which determines a number of columns, among the plurality of columns, to be permutated according to the calculated number of bits and determines which columns, among the plurality of columns, reduce performance degradation caused by puncturing; and
    a column replacing unit which replaces columns which reduce performance degradation caused by puncturing with columns not determined to reduce performance degradation caused by puncturing.

13. The apparatus of claim 8, wherein the punctured bit position determining unit determines a column where one variable node is punctured among a plurality of variable nodes connected to one check node on a factor graph according to a characteristic of a low density parity check code as a column to be punctured.

14. A method for transmitting data coded by a low density parity check code, the method comprising:
    encoding input data by a low density parity check code, the encoding performed by a low density parity check encoder; and
    puncturing the encoded input data in an order of columns which reduces performance degradation caused by puncturing in the low density parity check code According to a code rate of output data,
    wherein the encoding comprises:
    generating a parity check matrix based on the low density parity check code, the parity check matrix comprising a plurality of columns and a plurality of rows;
    generating a column permutated matrix by permuting columns of the parity check matrix according to an order of columns which reduces performance degradation caused by puncturing;
    generating a generate matrix from the column permutated matrix; and
    encoding input data according to the generate matrix.

15. The method of claim 14,
    wherein the parity check matrix consists of elements of 0 and 1, and a number of 1's is less than a number of 0's.

16. The method of claim 15, wherein the generating the column permutated matrix comprises:
    calculating a number of bits to be punctured according to a maximum code rate among a plurality of required code rates;
    determining a number of columns to be permutated according to the calculated number of bits and determining which columns, among the plurality of columns, reduce performance degradation caused by puncturing; and
    replacing columns which reduce performance degradation caused by puncturing with columns not determined to reduce performance degradation caused by puncturing.

17. The method of claim 16, wherein in the determining the number of columns, a column where one variable node is punctured among a plurality of variable nodes connected to one check node on a factor graph according to a characteristic of a low density parity check code is determined as a column to be punctured.

18. The method of claim 16, wherein the determining the number of columns comprises:
    selecting a column having a least number of 1's in a low density parity check matrix;
    analyzing rows of 1's in the selected column; and
    determining a $j^{th}$ column as a candidate column to be punctured if the $j^{th}$ column satisfies a predetermined condition in a case that the $j^{th}$ column is the selected column, wherein the predetermined condition is that there is at least one of the rows of 1 's which has non-punctured columns of non-0 elements.

19. The method of claim 18, wherein the determining the number of columns, the $j^{th}$ column is determined as a column to be punctured if $0^{th}$ to $(j-1)^{th}$ columns satisfy the predetermined condition.

20. A method for transmitting data coded by a low density parity check code, the method comprising:
    encoding input data by a low density parity check code, the encoding performed by a low density parity check encoder; and
    puncturing the encoded input data in an order of columns which reduces performance degradation caused by puncturing in the low density parity check code according to a code rate of output data,
    wherein the encoding further comprises permuting columns in the low density parity check code according to an order of columns which reduced performance degradation caused by puncturing.

21. The method of claim 20, wherein in the permuting columns, columns which reduce performance degradation caused by puncturing are replaced with left most columns or right most columns.

22. The method of claim 21, wherein, in the puncturing, bits are punctured according to a code rate of the output data in an order from a left side column in encoded input data.

23. A method for receiving data coded by a low density parity check code, the method comprising:
    inserting bits to corresponding punctured position as many as the number of bits punctured at a transmitting side according to a code rate of a receiving data punctured in order of columns in which performance degradation caused by puncturing is reduced; and
    performing a low density parity check decoding of the data output by the inserting means based on a low parity check code in which columns are permutated in an order of columns which reduced performance degradation caused by puncturing.

24. The method of claim 23, wherein in the inserting bits, a corresponding number of bits are inserted in columns in an order from a left side column in data which is input.

25. The method of claim 23, wherein the performing the low density parity check decoding comprises:
    performing a soft decision for a signal of bit-inserted data; and
    decoding the soft-decided signal based on the low density parity check code.

26. The method of claim 25, wherein the performing the low parity check decoding further comprises:
    generating a parity check matrix comprising a plurality of columns and a plurality of rows, and having elements of 0 or 1, wherein a number of 1's is less than a number of 0's; and
    generating a column permutated matrix by permuting columns of the parity check matrix according to an order of columns which reduced performance degradation caused by puncturing.

27. The method of claim 26, wherein the generating the column permutated matrix comprises:
    calculating a number of bits to be punctured according to a maximum code rate among a plurality of required code rates;
    determining a number of columns, among the plurality of columns, to be permutated according to the calculated number of bits and determining which columns, among the plurality of columns, reduce performance degradation caused by puncturing; and
    replacing columns which reduce performance degradation caused by puncturing with columns not determined to reduce performance degradation caused by puncturing.

28. The method of claim 27, wherein in the determining the number of columns, a column where one variable node is punctured among a plurality of variable nodes connected to one check node on a factor graph according to a characteristic of a low density parity check code is determined as a column to be punctured.

29. The method of claim 28, wherein the determining the number of columns comprises:
    selecting a column having least number of 1's in a low density parity check matrix;

analyzing rows of 1's in the selected column; and
determining a $j^{th}$ column as a candidate column to be punctured if the $j^{th}$ column satisfies a predetermined condition in a case that the $j^{th}$ column is the selected column, wherein the predetermined condition is that there is at least one of the rows of 1's which has non-punctured columns of non-0 elements.

30. The method of claim 29, wherein the determining the number of columns, the $j^{th}$ column is determined as a column to be punctured if $0^{th}$ to $(j-1)^{th}$ columns satisfy the predetermined condition.

* * * * *